(12) United States Patent
Hashimoto et al.

(10) Patent No.: US 6,735,667 B2
(45) Date of Patent: *May 11, 2004

(54) SYNCHRONOUS DATA SYSTEM WITH CONTROL DATA BUFFER

(75) Inventors: Masashi Hashimoto, Garland, TX (US); Gene A. Frantz, Missouri City, TX (US); John Victor Moravec, Willow Springs, IL (US); Jean-Pierre Dolait, Villeneuve-Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/449,432

(22) Filed: May 30, 2003

(65) Prior Publication Data

US 2003/0196034 A1 Oct. 16, 2003

Related U.S. Application Data

(62) Division of application No. 10/190,017, filed on Jul. 5, 2002, which is a division of application No. 09/745,892, filed on Dec. 21, 2000, now Pat. No. 6,418,078, which is a division of application No. 08/488,231, filed on Jun. 7, 1995, now Pat. No. 6,188,635, which is a division of application No. 08/362,289, filed on Dec. 22, 1994, now Pat. No. 5,636,176, which is a division of application No. 08/175,478, filed on Dec. 29, 1993, now Pat. No. 5,400,288, which is a continuation of application No. 07/843,780, filed on Feb. 28, 1992, now abandoned, which is a division of application No. 07/512,611, filed on Apr. 20, 1990, now Pat. No. 5,093,807, which is a continuation of application No. 07/137,305, filed on Dec. 23, 1987, now abandoned.

(51) Int. Cl.[7] ............... G11C 8/00; G11C 11/408; G11C 11/409

(52) U.S. Cl. ............. 711/105; 711/217; 711/218; 365/220; 365/230.08; 365/230.09; 365/233

(58) Field of Search .......... 365/230.08, 230.09, 365/220, 221, 233, 239, 240; 711/105, 217, 218

(56) References Cited

U.S. PATENT DOCUMENTS

| 3,740,723 A | 6/1973 | Beausoleil et al. ......... 395/425 |
| 3,758,761 A | 9/1973 | Henrion ....................... 371/8.1 |

(List continued on next page.)

FOREIGN PATENT DOCUMENTS

| EP | 0147268 A2 | 7/1985 | ............ G11C/8/00 |
| EP | 0276870 A2 | 7/1985 | ............ G11C/8/00 |
| EP | 0162234 A2 | 11/1985 | ............ G11C/8/00 |
| JP | 59 56276 | 9/1982 | ............ G11C/8/00 |
| JP | 62 152 050 | 7/1987 | ........... G06F/12/00 |

OTHER PUBLICATIONS

Bell Laboratories, Incorporated, *Transmission Systems for Communications*, 5th Edition, 1982, pp. 590–591.

(List continued on next page.)

*Primary Examiner*—Jack A. Lane
(74) *Attorney, Agent, or Firm*—Lawrence J. Bassuk; W. James Brady; Frederick J. Telecky, Jr.

(57) ABSTRACT

A memory circuit (14) having features specifically adapted to permit the memory circuit (14) to serve as a video frame memory is disclosed. The memory circuit (14) contains a dynamic random access memory array (24) with buffers (18, 20) on input and output data ports (22) thereof to permit asynchronous read, write and refresh accesses to the memory array (24). The memory circuit (14) is accessed both serially and randomly. An address generator (28) contains an address buffer register (36) which stores a random access address and an address sequencer (40) which provides a stream of addresses to the memory array (24). An initial address for the stream of addresses is the random access address stored in the address buffer register (36).

17 Claims, 3 Drawing Sheets

U.S. PATENT DOCUMENTS

| | | | | |
|---|---|---|---|---|
| 3,771,145 A | 11/1973 | Wiener | | 365/240 |
| 3,821,715 A | 6/1974 | Hoff et al. | | 340/173 |
| 3,882,470 A | 5/1975 | Hunter | | 364/200 |
| 3,895,360 A | 7/1975 | Cricchi et al. | | 340/173 R |
| 3,924,241 A | 12/1975 | Kronies | | 395/425 |
| 3,956,737 A | 5/1976 | Ball | | 340/172.5 |
| 3,962,689 A | 6/1976 | Brunson | | 340/173 R |
| 3,969,706 A | 7/1976 | Proebsting et al. | | 365/189.02 |
| 3,972,028 A | 7/1976 | Weber et al. | | 395/425 |
| 3,975,714 A | 8/1976 | Weber et al. | | 395/800 |
| 3,983,537 A | 9/1976 | Parsons et al. | | 395/425 |
| 4,007,452 A | 2/1977 | Hoff | | 365/63 |
| 4,038,648 A | 7/1977 | Chesley | | 365/201 |
| 4,099,231 A | 7/1978 | Kotok et al. | | 395/425 |
| 4,120,048 A | 10/1978 | Fuhrman | | 365/239 |
| 4,152,781 A | 5/1979 | Aichelmann, Jr. | | 365/239 |
| 4,191,996 A | 3/1980 | Chesley | | 395/425 |
| 4,205,373 A | 5/1980 | Shah | | 395/425 |
| 4,225,947 A | 9/1980 | Councill et al. | | 365/238 |
| 4,247,817 A | 1/1981 | Heller | | 307/354 |
| 4,249,247 A | 2/1981 | Patel | | 395/425 |
| 4,286,321 A | 8/1981 | Baker et al. | | 364/200 |
| 4,306,298 A | 12/1981 | McElroy | | 395/425 |
| 4,315,308 A | 2/1982 | Jackson | | 364/200 |
| 4,321,695 A | 3/1982 | Redwine et al. | | 365/174 |
| 4,333,142 A | 6/1982 | Chesley | | 395/500 |
| 4,355,376 A | 10/1982 | Gould | | 365/200 |
| 4,373,183 A | 2/1983 | Means et al. | | 395/400 |
| 4,375,084 A | 2/1983 | Urushibata | | 364/900 |
| 4,385,350 A | 5/1983 | Hansen et al. | | 365/229 |
| 4,388,696 A | 6/1983 | Test, II et al. | | 364/900 |
| 4,415,994 A | 11/1983 | Ive et al. | | 365/189 |
| 4,435,792 A | 3/1984 | Bechtolsheim | | 365/230 |
| 4,443,864 A | 4/1984 | McElroy | | 395/325 |
| 4,449,207 A | 5/1984 | Kung et al. | | 365/189.4 |
| 4,468,738 A | 8/1984 | Hansen et al. | | 395/325 |
| 4,470,114 A | 9/1984 | Gerhold | | 395/325 |
| 4,481,625 A | 11/1984 | Roberts et al. | | 370/85 |
| 4,488,218 A | 12/1984 | Grimes | | 395/325 |
| 4,493,060 A | 1/1985 | Varshney | | 365/238 |
| 4,500,905 A | 2/1985 | Shibata | | 357/68 |
| 4,509,142 A | 4/1985 | Childers | | 364/900 |
| 4,519,034 A | 5/1985 | Smith et al. | | 395/550 |
| 4,549,283 A | 10/1985 | McDermott, III | | 365/194 |
| 4,558,377 A | 12/1985 | Collins et al. | | 360/10.1 |
| 4,567,579 A | 1/1986 | Patel et al. | | 365/189 |
| 4,581,721 A | 4/1986 | Gunawardana | | 365/230 |
| 4,595,923 A | 6/1986 | McFarland, Jr. | | 340/825.5 |
| 4,608,669 A | 8/1986 | Klara et al. | | 365/201 |
| 4,608,678 A | 8/1986 | Threewitt | | 365/189 |
| 4,618,947 A | 10/1986 | Tran et al. | | 365/230 |
| 4,630,193 A | 12/1986 | Kris | | 395/325 |
| 4,633,441 A | 12/1986 | Ishimoto | | 365/189 |
| 4,646,270 A | 2/1987 | Voss | | 365/189.02 |
| 4,649,511 A | 3/1987 | Gdula | | 395/425 |
| 4,649,516 A | 3/1987 | Chung et al. | | 365/250 |
| 4,654,655 A | 3/1987 | Kowalski | | 340/825.5 |
| 4,664,502 A | 5/1987 | Fukushima et al. | | 365/219 |
| 4,667,313 A | 5/1987 | Pinkham et al. | | 365/240 |
| 4,685,089 A | 8/1987 | Patel et al. | | 365/233 |
| 4,706,166 A | 11/1987 | Go | | 361/403 |
| 4,719,627 A | 1/1988 | Peterson et al. | | 371/40.2 |
| 4,745,548 A | 5/1988 | Blahut | | 395/425 |
| 4,764,846 A | 8/1988 | Go | | 361/388 |
| 4,770,640 A | 9/1988 | Walter | | 439/69 |
| 4,779,089 A | 10/1988 | Theus | | 340/825.5 |
| 4,785,394 A | 11/1988 | Fischer | | 395/325 |
| 4,789,960 A | 12/1988 | Willis | | 364/900 |
| 4,796,224 A | 1/1989 | Kawai et al. | | 365/51 |
| 4,811,202 A | 3/1989 | Schabowski | | 395/325 |
| 4,818,985 A | 4/1989 | Ikeda | | 340/825.5 |
| 4,833,651 A | 5/1989 | Seltzer et al. | | 365/189.07 |
| 4,837,682 A | 6/1989 | Culler | | 395/325 |
| 4,860,198 A | 8/1989 | Takenaka | | 364/200 |
| 4,899,316 A | 2/1990 | Nagami | | 365/189.01 |
| 4,933,835 A | 6/1990 | Sachs et al. | | 364/200 |
| 4,975,763 A | 12/1990 | Baudouin et al. | | 357/74 |
| 4,999,814 A | 3/1991 | Hashimoto | | 365/222 |
| 5,023,488 A | 6/1991 | Gunning | | 307/475 |
| 5,179,670 A | 1/1993 | Farmwald et al. | | 395/325 |
| 5,319,755 A | 6/1994 | Farmwald et al. | | 395/325 |

FOREIGN PATENT DOCUMENTS

| | | | | |
|---|---|---|---|---|
| EP | 0147268 A2 | 7/1985 | | G11C/8/00 |
| EP | 0276870 A2 | 7/1985 | | G11C/8/00 |
| EP | 0162234 A2 | 11/1985 | | G11C/8/00 |
| JP | 59 56276 | 9/1982 | | G11C/8/00 |
| JP | 62 152 050 | 7/1987 | | G06F/12/00 |

OTHER PUBLICATIONS

Cole, Bernard C., "Motorola's Radical SRAM Design Speeds Systems 40%, Electronics", Jul. 23, 1987, pp. 66–68.

Hashimoto, Masashi et al., "A 20–ns 256K X 4 FIFO Memory", IEEE Journal of Solid–State Circuits, vol. 23, No. 2, Apr. 1988, pp. 490–499.

Hashimoto, Masashi et al., "A 20 ns 256K X 4 FIFO Memory", IEEE 1987 Custom Integrated Circuits Conference, May 4–7, 1987, pp. 315–318.

Horowitz, Mark et al., "MIPS–X: A 20–MIPS Peak, 32–bit Microprocessor with On–Chip Cache", IEEE Journal of Solid–Circuits, vol. SC–22, No. 5, Oct. 1987, pp. 790–799.

Lineback, J. Robert, "System Snags Shouldn't Slow the Boom in Fast Static RAMS", Electronics, Jul. 23, 1987, pp. 60–62.

Bell Laboratories, Incorporated, *Transmission Systems for Communications*, 5th Edition, 1982, pp. 590–591.

Cole, Bernard C., "Motorola's Radical SRAM Design Speeds Systems 40%, Electronics", Jul. 23, 1987, pp. 66–68.

Hashimoto, Masashi et al., "A 20–ns 256K X 4 FIFO Memory", IEEE Journal of Solid–State Circuits, vol. 23, No. 2, Apr. 1988, pp. 490–499.

Hashimoto, Masashi et al., "A 20 ns 256K X 4 FIFO Memory", IEEE 1987 Custom Integrated Circuits Conference, May 4–7, 1987, pp. 315–318.

Horowitz, Mark et al., "MIPS–X: A 20–MIPS Peak, 32–bit Microprocessor with On–Chip Cache", IEEE Journal of Solid–Circuits, vol. SC–22, No. 5, Oct. 1987, pp. 790–799.

Lineback, J. Robert, "System Snags Shouldn't Slow the Boom in Fast Static RAMS", Electronics, Jul. 23, 1987, pp. 60–62.

Miyaguchi et al., "A Field Store System With Single 1Mbit Field Memory", IEEE Transactions on Consumer Electronics, vol. 34, No. 3, Aug. 1988, pp. 397–401.

Morris, S. Brent et al., "Processes for Random and Sequential Accessing in Dynamic Memories", IEEE Transactions on Computers, vol. C–28, No. 3, Mar. 1979, pp. 225–237.

Motorola, :16Kx4 Bit Synchronous Statis RAM with Output Registers and Output Enable, Motorola Semiconductor Technical Data, MCM6293.

Motorola, "16Kx4 Bit Synchronous Statis RAM with Output Registers and Output Enable", Motorola Semiconductor Technical Data, MCM6294.

Nakagawa et al., "A 1 Mb Field Memory For TV Pictures", IEEE 1987 Custom Integrated circuits Conference, pp. 319–332.

Ohara, Kazuhiro et al., "A Field Store System With Single 1Mbit Field Memory, ICCE Digest of Technical Papers", pp. 70–71, Jun., 1988.

Wada, R. et al., "A Color Television Receiver With Digital Frame Memory", 1966 IEEE Transactions on Consumer Electronics, vol. 4, No. 3, pp. 128–129.

Hawley, David, "Superfast Bus Supports Sophisticated Transactions," High Performance Systems, Sep. 1989.

T. Yang, M. Horowitz, B. Wooley, "A 4–ns 4KX1–bit Two–Port BiCMOS SRAM," IEEE Journal of Solid–State Circuits, vol. 23, No. 5, pp. 1030–1040 (Oct. 1988).

"Burndy Connects Advertisement," Electronic Engineering Times, pp. T24–T25 (Feb. 24, 1986).

A. Kahn, "What's the Best Way to Minimize Memory Traffic," High Performance Systems, pp. 59–67 (Sep. 1989).

N. Margulis, "Single Chip RISC CPU Eases System Design." High Performance Systems, pp. 34–36, 40–41, 44 (Sep. 1989).

R. Matick, "Comparison of Memory Chip Organizations vs. Realiability in Virtual Memories,"FTCS 12th Annual International Symposium Fault–Tolerant Computing, IEEE Computer Society Fault–Tolerant Technical Committee, pp. 223–227 (Jun. 22, 1982).

Agarwal et al., "Scaleable Director Schemes for Cache Consistency,"15th Intern. Sump. Comp. Architecture, pp. 280–289 (Jun. 1988).

Agarwal et al., "An Analytical Cache Model,"ACM Trans. on Computer Systems, vol. 7 No. 2, pp. 184–215 (May 1989).

Davidson, "Electrical Design of a High Speed Computer Package", IBM J. Res. Develop., vol. 26, No. 3, pp. 349–361 (1982).

Hart, "Multiple Chips Speed CPU Subsystems", High–Performance Systems, pp. 26–55 (Sep. 1989).

Beresford, "How to Tame High Speed Design", High–Performance Systems, pp. 78–83 (Sep. 1989).

Carson, "Advance On–Focal Plane Signal Processing for Non–Planar Infared Mosaics,"SPIE, vol. 311, pp. 53–58 (1981).

Horowitz et al., "MIPS–X: A 20–MIPS Peak 32–Bit Microprocessor with ON–Chip Cache,"IEEE J. Solid State Circuits, vol. SC–22, No. 5, pp. 790–799 (Oct. 1987).

Kwon et al., "Memory Chip Organizations for Improved Reliability in Virtual Memories,"IBM Technical Disclosure Bulletin, vol. 25, No. 6, Nov. 1982, pp. 2952–2957.

Pease et al., "Physical Limits to the Useful Packaging Density of Electronic Systems," IBM J. Res. Develop. vol. 32 No. 5, (Sep. 1988).

Peterson, "System–Level Concerns Set Performance Gains,"High–Performance Systems, pp. 71–77 (Sep. 1989).

Wooley et al., "Active Substrate System Integration," Private Communication, Semiconductor Research Corporation, 4 pages (Mar. 15, 1988).

H. Schumacher, "CMOS Subnanosecond True–ECL Output Buffer,"IEEE Journal of Solid–State Circuits, vol. 25, No. 1, pp. 150–154 (Feb. 1990).

Kimura et al., "Power Reduction Techniques in Megabit DRAM's", IEEE Journal of Solid–State Circuits, vol. SC–21, No. 3, Jun. 1968.

Nogami et al., "1–Mbit Virtually Static RAM, IEEE Journal of Solid–State Circuits", vol. SC–21, No. 5, Oct. 1986.

Ohta et al., "A 1–Mbit DRAM with 33–MHz Serial I/O Ports", IEEE Journal of Solid–State Circuits, vol. SC–21, No. 5, Oct. 1986.

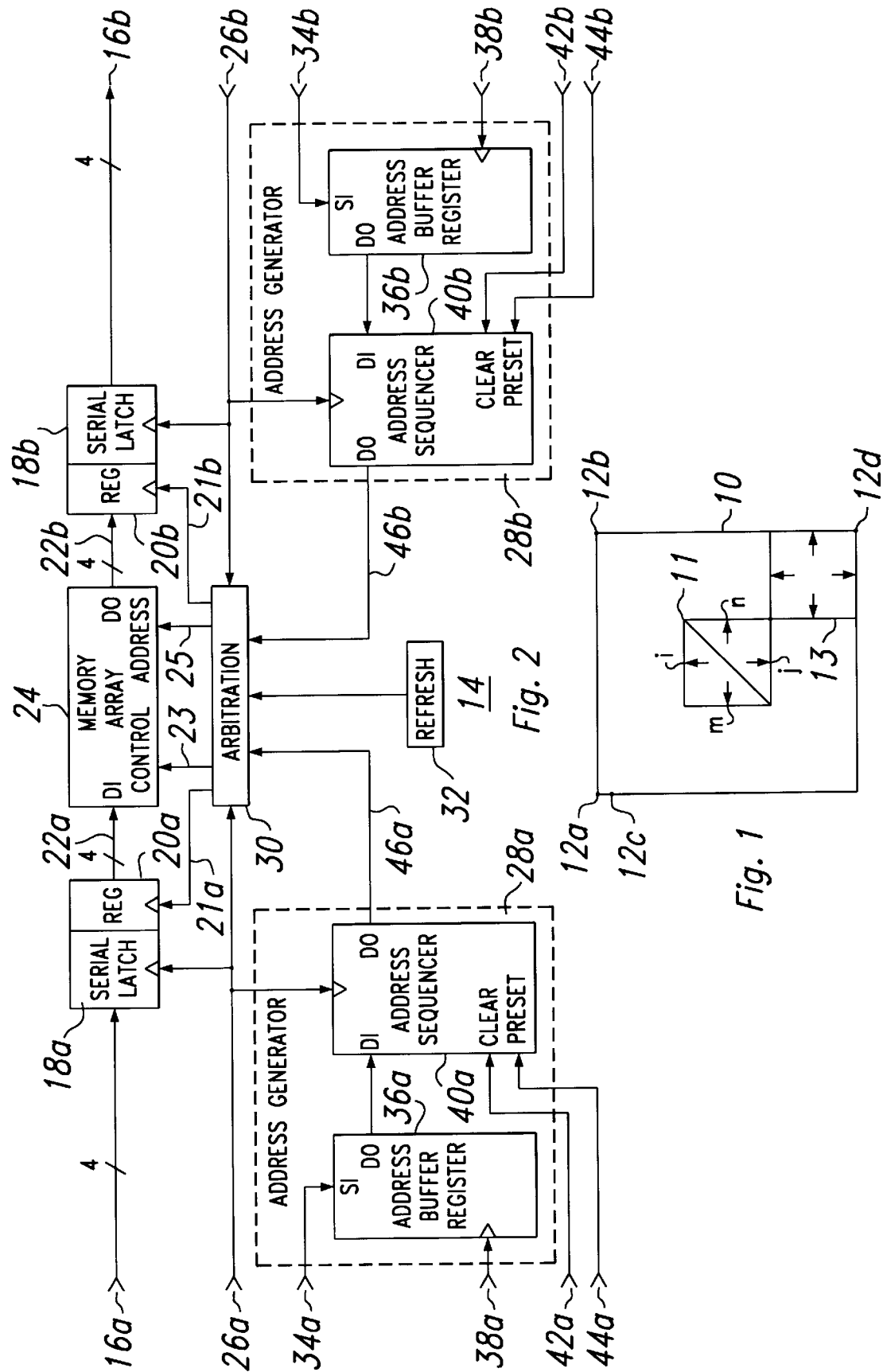

SYNCHRONOUS DATA SYSTEM WITH CONTROL DATA BUFFER

This application is a divisional of prior application Ser. No. 10/190,017, filed Jul. 5, 2002, pending; which was a divisional of application Ser. No. 09/745,892, filed Dec. 21, 2000, now U.S. Pat. No. 6,418,078, issued Jul. 9, 2002; which was a divisional of application Ser. No. 08/488,231, filed Jun. 7, 1995, now U.S. Pat. No. 6,188,635, which was a divisional of application Ser. No. 08/362,289 filed Dec. 22, 1994, now U.S. Pat. No. 5,636,176, which was a divisional of application Ser. No. 08/175,478 filed Dec. 29, 1993, now U.S. Pat. No. 5,400,288, which was a continuation of application Ser. No. 07/843,780 filed Feb. 28, 1992, abandoned, which was a divisional of application Ser. No. 07/512,611 filed Apr. 20, 1990, now U.S. Pat. No. 5,093,807, which was a continuation of application Ser. No. 07/137,305 filed Dec. 23, 1987, abandoned.

TECHNICAL FIELD OF THE INVENTION

The present invention relates in general to digital memory circuits. Specifically, the present invention relates to digital memory circuits which have particular advantages when used in connection with video applications.

BACKGROUND OF THE INVENTION

Digital TV, VCR, and related video applications often utilize a frame or field memory that stores pixels which together represent an entire frame of video. Such a frame memory is used in producing a variety of special effects, such as frame freezing, zoom, pan, split screen monitoring, and the like. Although a frame memory may be constructed using conventional discrete integrated circuits, such a frame memory is relatively expensive, dissipates an undesirably large amount of power, and occupies an undesirably large amount of space. When such a frame memory is targeted for use in a commercial product, these problems are major ones. Accordingly, a single integrated circuit, either alone or in combination with as few other integrated circuits as possible, improves upon a frame memory which has been constructed from conventional discrete integrated circuits.

Prior art integrated circuit devices have attempted to address the frame memory problem. However, such devices fail to provide an architecture which adequately addresses video application needs. For example, devices which include only a few of the typically needed frame memory functions may be used in providing a wide variety of special effects. However, they must be combined with such a large quantity of conventional discrete integrated circuits that little improvement results over constructing a frame memory entirely from conventional discrete integrated circuits. On the other hand, a conventional frame memory integrated circuit may include a random access memory with complete on-chip address calculation. A video application which utilizes such a frame memory accesses the entire frame memory serially. Thus, frame freeze and split screen monitoring special effects are supported. However, zoom and pan functions are either impossible or impractical using such a device.

Accordingly, the industry feels a need for a frame memory integrated circuit which optimizes circuit architecture to accommodate a wide variety of special effects without requiring a large quantity of surrounding integrated circuits.

SUMMARY OF THE INVENTION

Accordingly, it is an advantage of the present invention that a frame memory circuit is provided which permits limited random access. Consequently, a device constructed according to the teachings of the present invention may be efficiently used to perform a wide variety of special effect video applications.

Another advantage of the present invention is that a memory circuit is provided which includes a variety of address calculation modes. Thus, a portion of the address calculations for certain special effect functions may be transferred to the memory circuit, and a video application which utilizes such a memory circuit need not allocate processing power to such calculations.

The above advantages of the present invention are carried out in one form by a memory circuit which stores and provides steams of data. This memory circuit supports both serial access and random access. A data input of a random access memory array couples to a data buffer so that the data buffer may synchronize operation of the memory array with the streams of data. An address input of the random access memory array couples to an address sequencer which generates a sequence of memory addresses that are successively applied to the memory array. An address buffer request also couples to the address sequencer. The address buffer register supplies a random access address to the address sequencer to initialize the sequence of memory addresses supplied by the address sequencer.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

FIG. 1 illustrates a frame of a video display screen with which the present invention may be used;

FIG. 2 shows a block diagram of a memory circuit built according to the teachings of the present invention;

DETAILED DESCRIPTION

Figure 3:
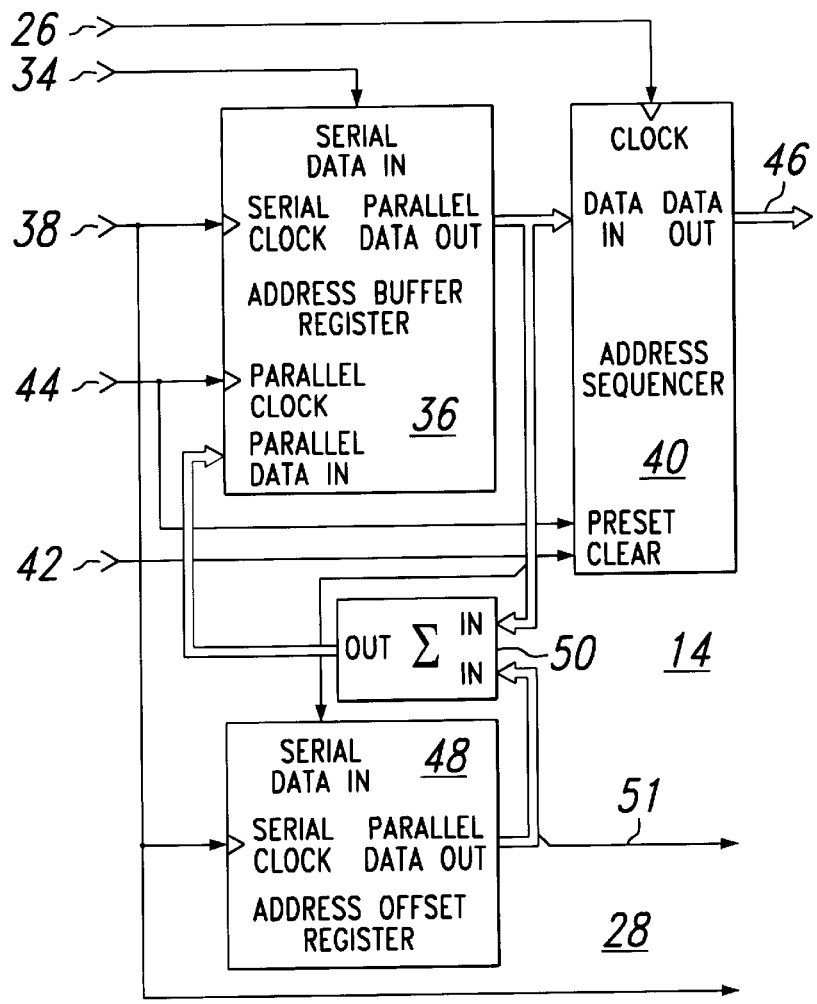
FIG. 3 shows a block diagram of a first alternate embodiment of an address generator portion of a memory circuit built according to the teachings of the present invention.

FIG. 1 illustrates a video frame 10, such as may appear on a TV tube or other video display terminal. Although frame 10 may appear as a continuous analog video picture to a viewer, frame 10 may be electrically represented as a multiplicity of digitized pixels 12. Each one of the pixels defines parameters, such as color and relative intensity, for one of a multiplicity of very small dot areas within the picture of frame 10. Accordingly, the video frame 10 may contain a relatively large number of the digitized pixels 12. For example, a frame containing 488 columns of pixels 12 by 488 rows of pixels 12 has a total of 238,144 pixels per frame.

Pixels 12 are typically transmitted or otherwise processed in a predetermined sequential order to preserve the spatial relationship between the pixels 12. For example, in a conventional raster scan application, pixels 12 may be transmitted to a memory device for storage or from storage in a memory device to a video display in successive order beginning with a pixel 12a, that represents the pixel 12 in the first column of the first row of frame 10, and continuing in successive order to a pixel 12b, which represents the pixel 12 in the last column of the first row of frame 10. Immediately following the transmission of pixel 12b and sync information (not shown), a pixel 12c, which represents the pixel 12 in the first column of the second row, may be transmitted followed in successive order by the remaining pixels 12 contained in the second row of frame 10. Transmission of pixels 12 continues in this fashion until a pixel 12d, which represents the pixel 12 in the last column of the last row of frame 10, has been transmitted. Thus, any processing device which knows the timing relationship between an arbitrarily located pixel 12 and the beginning pixel 12a also knows or can easily calculate the spatial location of such arbitrarily located pixel 12 within frame 10.

A digital TV, VCR, or the like may contain a large frame or field memory which is capable of storing all of the pixels 12 within frame 10. Pixels 12 collectively appear as a serial data stream when they are applied to the frame memory. Except for special effects, the relative order of pixels 12 in this serial data stream must generally be preserved when they are read from the frame memory to preserve the spatial relationships between the pixels 12. Some special effects do not require this preserved order, and valuable computation time may be wasted by precisely preserving the order of the pixels 12 as the pixels 12 are being read from the frame memory.

One such special effect is a zoom effect wherein a small portion of a stored, digitized frame is expanded and converted to an analog signal to fill an entire video display. For example, if frame 10 in FIG. 1 represents an entire video display, then an area 11 within frame 10 bounded by rows i and j and columns m and n is expanded in a zoom special effect to fill the entire frame 10. Thus, in the zoom special effect all of the digitized pixels 12 residing within frames 10 outside of the area 11 bounded by rows i and j and columns m and n are inactive and may be discarded. In other words, these inactive ones of the pixels 12 need not be read from the frame memory. Consequently, the pixel 12 located at column m and row i will be utilized as the first active pixel 12a transmitted to the video display in the zoom special effect. Active pixels 12 may be duplicated to complete an entire row of frame 10, and rows may be duplicated to complete the vertical component of the zoom effect. All of the digitized pixels transmitted to the video screen are converted to an analog signal for display on the video screen.

In a split screen special effect, an entire frame 10 may be shrunk into a small area 13 of a screen, such as that bounded by row j and the last row of frame 10, and column n and the last column of frame 10. This special effect is accomplished by utilizing only active ones of the pixels 12 out of each of a predetermined number of the pixels 12 from an entire frame 10 of the pixels 12, and ignoring the intervening inactive ones of the pixels 12 (ie. skipping inactive pixels). For the example depicted in FIG. 1, the shrunken frame is formed using only the active pixels 12 that reside in one of every three columns and one of every three rows of the frame 10.

The present invention provides a memory circuit which series as a frame memory and permits these and other special effects to be performed efficiently. FIG. 2 shows a block diagram of a memory circuit 14 built according to the teachings of the present invention. In general, the preferred embodiment of memory circuit 14 represents a single chip integrated circuit that contains $2^{20}$ or 1,048,576 bits of memory storage organized as 262,144 four bit wide words with special write and read access arrangements. Accordingly, a sufficient quantity of word storage is provided to buffer or store an entire 488.times.488 frame of the pixels 12 (see FIG. 1). If more than four bits of precision are required to accurately describe each pixel, then additional ones of memory circuit 14 may be used to store such additional bits Memory circuit 14 generally operates in a serial access mode for both write and read operations but has particular features which permit random access for writing or reading of the memory circuit 14 on a limited scale. Those skilled in the art will understand that serial access refers to a mode of storing and reading data in which the data must be read out from a memory in the same order sequential address in which it was stored into the memory. Furthermore, random access refers to the ability to write, read, or otherwise access any location in a memory array by supplying a selected unique address which corresponds to such memory location.

Specifically, for receiving analog video signals converted to digital pixels, memory circuit 14 includes a serial pixel data input 16a, which in the preferred embodiment supplies four bits of data per pixel. Serial pixel data input 16a couples to an input port of a write serial latch 18a, and an output port of write serial latch 18a couples to an input port of a write register 20a.

An output port of write register 20a couples to a data input port 22a of a memory array 24. In the preferred embodiment, memory array 24 is a dynamic random access memory (DRAM) array containing $2^{18}$ or 262,144 four bit memory locations. A data output port 22b of memory array 24 couples to a data input port of a read register 20b, and a data output port of read register 20b couples to a data input port of a read serial latch 18b. A data output port of read serial latch 18b couples to a serial pixel data output 16b, which in the preferred embodiment provides four bits of data per pixel for conversion to an analog video signal for display.

A serial write clock terminal 26a couples to a write address generator 28a, an arbitration and control circuit 30, and a clock input or write serial latch 18a. Similarly, a serial read clock terminal 26b couples to a read address generator 28b, arbitration and control circuit 30, and a clock input of read serial latch 18b. A refresh address and timing circuit 32 has an output which couples to an input of arbitration and control circuit 30, and outputs 21a, 21b, 23, and 25 from arbitration and control circuit 30 respectively couple to a clock input of write register 20a, a clock input of read register 20b, a control input of memory array 24, and an address input of memory array 24. Serial write clock terminal 26a and serial read clock terminal 26b receive respective write and read continuous clock signals each formed of rising and falling edges regularly spaced in time. The write and read clock signals are continuous during operation of memory circuit 14.

As shown in FIG. 2, address generators 28a and 28b comprises respective write and read address ports that are structurally similar to one another in the preferred embodiment. Thus, a write control data terminal 34a couples to a serial data input of an address buffer register 36a in write address generator 28a. A read control data terminal 34b couples to a serial data input of an address buffer register 36b in read address generator 23b. Likewise, a write control strobe terminal 38a couples to a clock input of address buffer register 36a, and a read control strobe terminal 38b couples to a clock input of address buffer register 36b. A data output of address buffer register 36a couples to a data input of an address sequencer 40a, and a data output of address buffer register 36b couples to a data input of an address sequencer 40b. A write reset terminal 42a couples to a clear input of address sequencer 40a, and a write transfer terminal 44a couples to a present input of address sequencer 40a. A read reset terminal 42b couples to a clear input of address sequencer 40b, and a read transfer terminal 44b couples to a preset input of address sequencer 40b. Serial write clock terminal 26a couples to a clock input of address sequencer 40a within address generator 28a, and serial read clock terminal 26b couples to a clock input of address sequencer 40b within address generator 28b. An output 46a of address sequencer 40a presents the output signal from address generator 28a and couples to an input of arbitration and control circuit 30. Likewise, an output 46b of address sequencer 40b presents the output signal from address generator 20b and couples to arbitration and control circuit 30. Memory circuit 14 may be provided in a 20 pin integrated circuit package.

As discussed above, memory circuit 14 may be operated in either a serial or a limited random access mode. In addition, the storing or writing of data into memory circuit 14 may occur asynchronously with the reading or providing of data from memory circuit 14. Asynchronous means timed by other than a common clock. Memory circuit 14 may be written into serially by activating write reset signal on terminal 42a to clear address sequencer 40a. Then, a four bit wide stream of serial data may be stored in memory circuit 14 by applying the four bit data nibbles at the write clock rate to the data input 16a while asserting a serial write clock signal at terminal 26a. One assertion of the serial write clock signal causes write serial latch 18a to temporarily store or buffer one four bit data nibble. Write serial latch 18a operates as a four bit wide shift register. Thus, subsequent four bit nibbles from the data stream of serial pixel data applied at data input 16a are shifted into serial latch 18a at the write clock rate upon subsequent assertions of the serial write clock signal.

In addition, each assertion of the serial write clock signal also causes address sequencer 40a of write address generator 28a to supply a new selected random access address to arbitration and control circuit 30. In other words, address sequencer 40a provides a stream of addresses to arbitration and control circuit 30 which corresponds to the stream of data being stored in write serial latch 18a.

Arbitration and control circuit 30 receives addresses from address generators 28a–28b and refresh address and timing circuit 32.

Circuit 30 monitors these inputs and various timing signals to decide which of the addresses provided on these inputs should be transferred at a specific time to memory array 24. Arbitration and control circuit 30 includes conventional logic circuits for controlling the timing operation of the dynamic memories which comprise memory array 24. Thus, arbitration and control circuit 30 passes an address generated by address generator 28a to memory array 24 so that data may be written into memory array 24, but a delay may occur due to refresh operations or read accesses of memory array 24. Accordingly, arbitration and control circuit 30 may additionally contain storage devices so that addresses generated by address generators 28a–28b are not lost when immediate access to memory array 24 is blocked. When arbitration and control circuit 30 identifies a time at which the serial pixel data may be written into memory array 24, such data is transferred from write serial latch 18a into write register 20a and then written into memory array 24. Accordingly, write serial latch 18a and write register 20a together represent a double buffering scheme which permits asynchronous operation of memory array 24 and particularly the storing of serial pixel data into memory circuit 14.

The reading of data from memory array 24 occurs in a manner similar to that described above for the storing of data onto memory array 24. Thus, an address generated by address generator 28b is transferred through arbitration and control circuit 30 at an appropriate time to cause data from memory array 24 to be read into read register 20b. Thereafter, this data is transferred into read serial latch 18b so that such data may be provided at data output terminal 16b through the application of a serial read clock signal at terminal 26b. Serial data is provided at output 16b asynchronously with the operation of memory array 24 and asynchronously with the storing of serial pixel data into memory circuit 14 at terminal 16a.

The limited random access feature of memory circuit 14 is provided through address generators 28a–28b. In the embodiment of memory circuit 14 shown in FIG. 2, write address generator 28a and read address generator 28b are structurally and operationally identical, except that write address generator 28a provides write addresses while read address generator 28b provides read addresses. Accordingly, both address generators 28a–28b are described below by reference only to write addresses generator 28a. Those skilled in the art will recognize that read address generator 28b operates identically in the preferred embodiment.

A random access address may be serially loaded into address buffer register 36a by applying such address to control data terminal 34a in a sequential manner and activating a control strobe signal applied at terminal 38a when valid data appear at terminal 34a. Thus, in the embodiment shown in FIG. 2, address buffer register 36a represents a serial shift register. The use of a serial shift register conserves the number of external pins needed for constructing memory circuit 14 in an integrated circuit when compared to a parallel loaded register. After the random access address has been entered into address buffer register 36a, it may be transferred to address sequencer 40a by the application of a write transfer signal at terminal 44a. In the preferred embodiments of the present invention, address sequencer 40a may represent a presetable, binary counter or other presetable sequencing circuit. Thus, the transferred address forms the initial address of a sequence of addresses which are subsequently generated by address generator 28a. If address sequencer 40a represents a binary counter, then subsequent addresses will increment or decrement starting with this present or initial value.

If memory array 24 contains $2^{18}$ four bit words of memory, then address buffer register 36a may advantageously represent an 18 bit register, and address sequencer 40a may represent an 18 bit counter, or other sequencing circuit. On the other hand, address buffer register 36a and address sequencer 40a may contain fewer bits, such as nine bits for example. In the nine bit situation, the random access address provided by address buffer register 36a could access the beginning of memory pages or rows wherein each page or row contains $2^9$ or 512 words of memory.

The inclusion of address buffer register 36a to provide a limited random access feature permits memory circuit 14 to be efficiently utilized in a zoom special effect. For example, a zoom effect may be accomplished by writing an entire frame of pixel data into memory array 24 using a serial write access mode. A beginning, preset or initial pixel address, such as the address of a pixel located at row i column m, in FIG. 1, may then be loaded into read address buffer register 36b and transferred to address sequencer 40b. A first row, such as row i, of the portion of frame 10 which is to be expanded into an entire frame may then be read from memory array 24 in a serial or sequential mode until a pixel corresponding to, for example, row i, column n, appears at output terminal 16b. Readout occurs at the serial read clock rate. A row may be repeated as often as necessary to achieve vertical zoom by transferring the random access address from address buffer register 36b to address sequencer 40b. An address corresponding to the pixel located at row i+1 and column m may then be loaded into address buffer register 36b and transferred to address sequencer 40b. This process continues at the serial read clock rate until a final pixel for the frame to be expanded has been output from memory array 24. The pixels are converted to analog video signals for display. Due to this feature, a video system need not start accesses of memory circuit 12 at an initial address, such as pixel 12a (shown in FIG. 1) and access inactive pixels stored within memory array 24. More efficient operation results.

The present invention contemplates alternate embodiments of address generators 28a–28b. A first alternate embodiment of address generators 28a–28b is shown in FIG. 3. FIG. 3 shows only one of address generators 28. The address generator 28 shown in FIG. 3 may serve as either write address generator 28a or read address generator 28b (see FIG. 2).

In this first alternate embodiment of an address generator 28, address buffer register 36 may be loaded both serially and in parallel. Thus, control data terminal 34, which may represent either write control data terminal 34a or read control data terminal 34b, as discussed above in connection with FIG. 2, couples to the serial data input of address buffer register 36. Control strobe terminal 38 couples to the serial clock input of address buffer register 36 and a serial clock input of an address offset register 48. The parallel data output of address buffer register 36 couples to a first input of an adder 50 and the data input of address sequencer 40. A parallel data output of address offset register 46 couples to a second input of adder 50. An output of adder 50 couples to a parallel data input of address buffer register 36, and transfer terminal 44 couples to a parallel clock input of address buffer 36 and the preset input of address sequencer 40. A most significant bit from the parallel data output or a serial output bit, of address buffer register 36 couples to a serial data input of address offset register 48. Serial clock terminal 26 couples to the clock input of address sequencer 40, and reset terminal 42 couples to a clear input of address sequencer 40. A data output of address sequencer 40 couples to address generator output 46.

Address buffer register 36 and address sequencer 40 operate in this first alternate embodiment similarly to their above-described operation in connection with address generator 28a–28b of FIG. 2. However, in this first alternate embodiment, the control data provided at terminal 34 is used to load both address buffer register 36 and address offset register 48. Thus, additional bits of control data are loaded into memory circuit 14 without requiring additional integrated circuit pins. Moreover, a most significant bit, or a serial output bit 51, from address offset register 48 may advantageously be routed to the control data input for the other one of read and write address generators 28a and 28b (see FIG. 1). In addition, the control strobe signal applied at terminal 38 may be routed to the other one of control strobe terminals 38a and 38b of FIG. 2. These two connections between address generators 28a and 28b eliminate two integrated circuit pins from the structure shown in FIG. 2.

In this first alternate embodiment of the present invention, the control data contained in address offset register 48 is added to a current initial address value contained in address buffer register 36 to provide a new initializing random access address value. This new initializing value is loaded into address buffer register 36 when the current address value is transferred into address sequencer 40.

Referring additionally to FIG. 1, the first alternate embodiment of the present invention may be advantageous in performing, for example, the zoom special effect. Thus, the address offset value loaded into address offset register 48 may represent the quantity of inactive pixels occurring between column n of one row and column m of the next row. At the end of each frame row a transfer signal may be asserted on terminal 44, and the random access address of the next active pixel, corresponding to column n of the next row, is automatically calculated and stored in address buffer register 36 to initiate another sequence of sequential accesses to memory circuit 14. Complexity of a video system employing memory circuit 14 decreases because components external to memory circuit 14 need not calculate this address.

Figure 4:
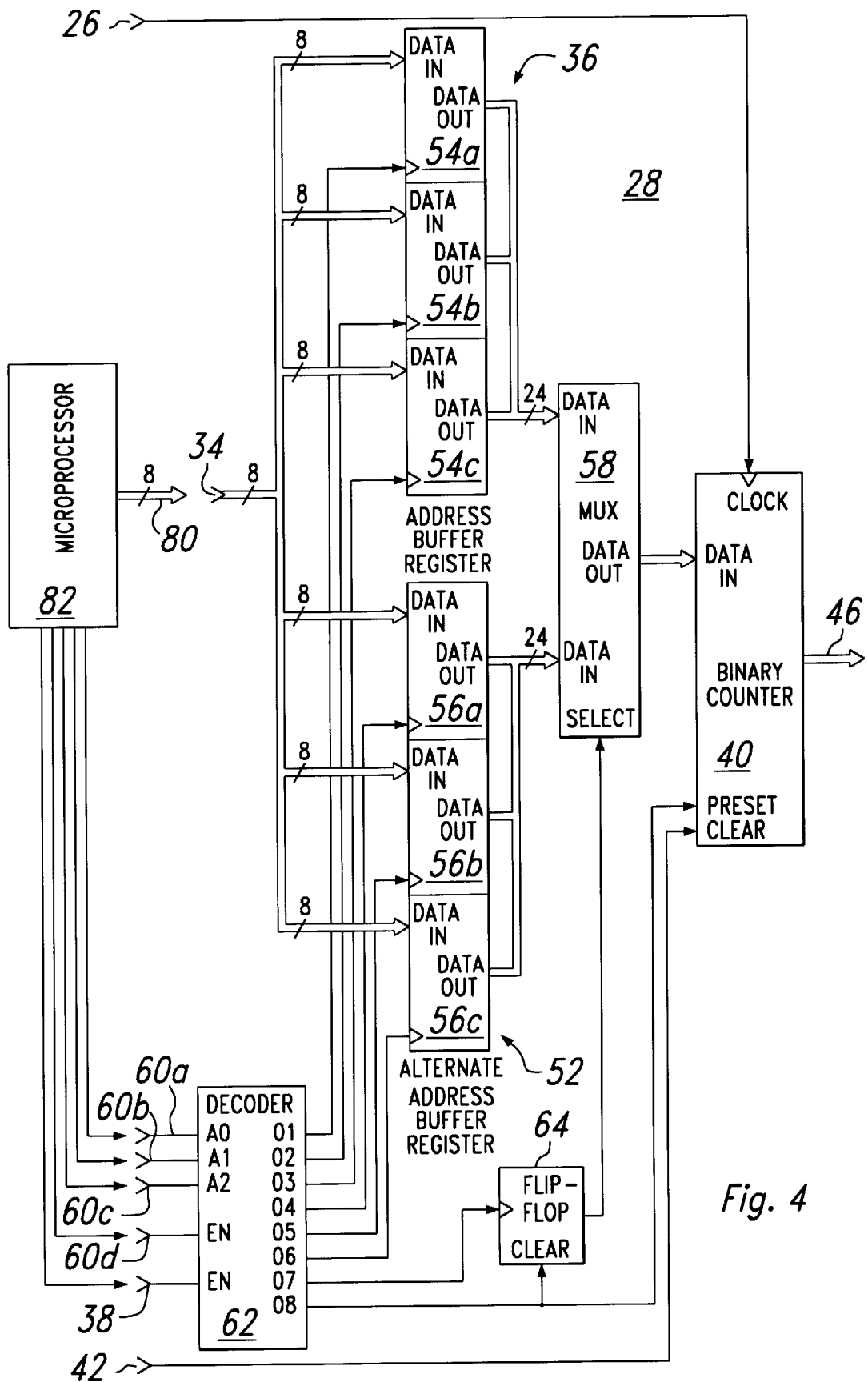
FIG. 4 shows a block diagram of a second alternate embodiment of an address generator portion of a memory circuit build according to the teachings of the present invention and connected to a microprocessor to form a system.

A second alternate embodiment of address generators 28a–28b from FIG. 2 is shown in FIG. 4. The FIG. 4 embodiment illustrates that random access addresses may be loaded into address buffer register 36 in a parallel fashion, which may be more compatible with conventional microprocessor integrated circuits. However, the number of integrated circuit pins needed to implement this embodiment increases over the embodiments discussed above in connection with FIGS. 2 and 3. In addition, FIG. 4 shows the inclusion of an alternate address buffer register 52 in addition to address buffer register 36. Specifically, control data terminals 34 may advantageously provide an eight bit microprocessor data bus 80 which couples to data inputs of individual eight bit portions 54a, 54b, and 54c of address buffer register 36. In addition, control data terminals 34 couple to data inputs of individual eight bit portions 56a, 56b, and 56c of alternate address buffer register 52. Data outputs of individual portions 54a–54c together form a 24 bit bus which couples to a first data input of a multiplexer 58. Likewise, data outputs of individual portions 56a–56c form a 24 bit bus which couples to a second data input of multiplexer 58. A data output of multiplexer 58 couples to a data input of a binary counter which serves as address sequencer 40 in this second alternate embodiment. Of course, those skilled in the art will recognize that the number of subregisters included within address buffer register 36 and alternate address buffer register 52 and the number of bits contained within the buses described above are subject to a substantial variation in accordance with specific application requirements.

In addition, microprocessor address input terminals 60a, 60b, and 60c, couple to address input of a decoder 62 and an address input terminal 60d couples to an enable input of decoder 62. The control strobe terminal 38, discussed above, couples to an enable input of decoder 62. Outputs 01–06 of decoder 62 couple to clock inputs of individual address buffer register portions 54a–54c and clock inputs of individual alternate address buffer register portions 56a–56c, respectively. An output 07 from decoder 62 couples to a clock input of a flip flop 64 which is configured to toggle upon the activation of the clock input. An output of flip flop 64 couples to a select input of multiplexer 58. An output 08 of decoder 62 couples to a preset input of binary counter 40. The serial clock 26 couples to a clock input of binary counter 40, and reset terminal 42 couples to a clear input of flip flop 64 and a clear input of binary counter 40. An output of binary counter 40 couples to output 46 of address generator 28.

In this second alternate embodiment of address generator 28, one initializing random access address may be stored in address register 36 while an alternate initializing random access address is stored in alternate address buffer register 52. A microprocessor 82 may store these addresses in memory circuit 14 through conventional memory or I/O write operations to addresses specified by signals applied on terminals 60a–60c. An address input bit applied at terminal 60d may advantageously distinguish between a write address generator 28a and a read address generator 28b (see FIG. 1). By applying an active signal to reset terminal 42, flip flop 64 and binary counter 40 may be initialized to a cleared state. At this point, address generator 28 operates substantially as described above in connection with FIG. 2. However, an alternate random access address stored in alternate address buffer 52 may selectively initialize binary counter 40. A microprocessor write operation which toggles flip flop 54, followed by a microprocessor write operation that transfers data into binary counter 40, initializes binary counter 40 with an alternate random access address. Flip flop 64 may be toggled by performing a write operation to the address which activates output 07 of decoder 62. A transfer operation from the selected one of address buffer registers 36 and 52 occurs by writing to the address which activates the output 08 of decoder 62.

Alternate address buffer register 52 may advantageously be used by a video system to efficiently buffer a line within a frame of data. Since memory circuit 14 of the preferred embodiment contains a sufficient quantity of memory to accommodate $2^{18}$ or 262,144 pixels, memory circuit 14 has unused memory locations when used to store a single frame of data which contains, for example, 480 pixel columns by 480 pixel rows. Accordingly, a random access address in this unused portion of memory may be loaded in alternate address buffer register 52. A single line of a frame may be efficiently stored in memory circuit 14 by transferring this alternate initial address value to binary counter 40, then sequentially storing such line of pixels into the otherwise unused portion of memory circuit 14.

In addition, the present invention contemplates alternative embodiments for address sequencer 40. As shown in FIG. 4, address sequencer 40 may represent a conventional presetable, clearable, binary counter. Such circuits are well known to those skilled in the art and need not be described in detail herein. However, address sequencer 40 may alternatively represent a circuit which increments or decrements by a variable step value which may differ from the value of one. Such a circuit is shown in FIG. 5.

Figure 5:
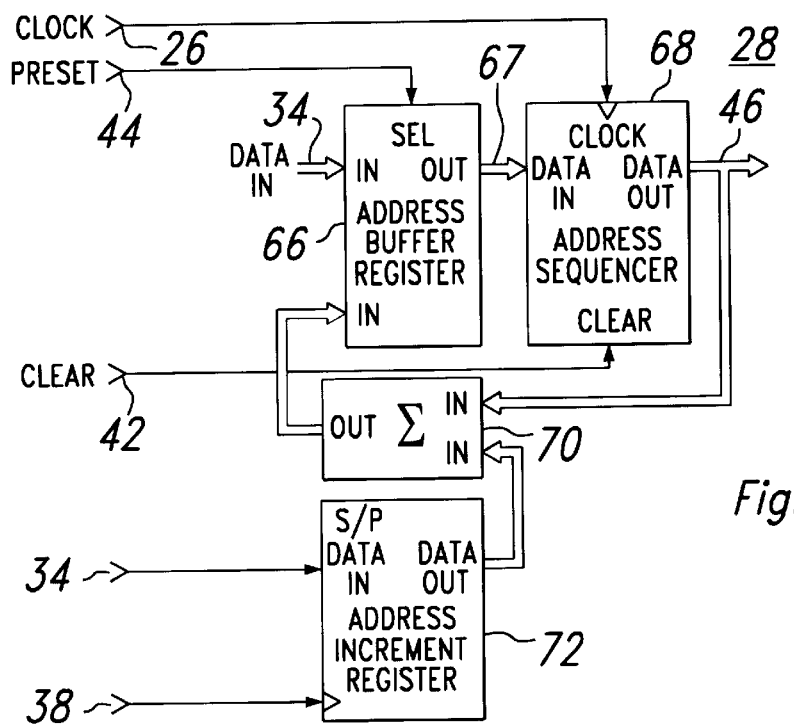
FIG. 5 shows a block diagram of an address sequencer utilized by the address generator portion of a memory circuit built according to the teachings of the present invention.

Accordingly, in FIG. 5 parallel address data input terminals 44 couple to a first input of an address buffer register 66. Preset terminal couples to a select input of address buffer register 66. An output 67 of register 66 couples to a data input of address sequencer 68, and the clock input terminal 26 of address sequencer 40 couples to a clock input of sequencer 68. Likewise, the reset or clear terminal 42 couples to a clear input of sequencer 68. A data output of sequencer 68 provides the data output of address sequencer 40 and additionally couples to a first input of an adder 70. An output of adder 70 couples to a second input of address buffer register 66. The address or control data terminals 34, discussed above in connection with FIGS. 2–4, also couple to a data input of an address increment register 72. Additionally, the control strobe terminal 38, discussed above in connection with FIGS. 2–4, couples to a clock input of register 72. A data output of the address increment register 72 couples to a second input of adder 70.

In this FIG. 5 embodiment of address sequencer 40, register 72 may represent either a parallel or a serially loaded register, as discussed above in connection with FIGS. 2–4. Additionally, if register 72 represents a serially loaded register, then register 72 may represent one register out of many coupled together in a long chain of serially loaded registers, as discussed above in connection with FIG. 3. The data loaded into register 72 is intended to represent a increment step by which sequencer 68 generates successive addresses at output 46 of address generator 28. A current output of address sequencer 68 is added to the step increment value from address increment register 72 in adder 70, and routed through buffer register 66 back to sequencer 68. Thus, a subsequent address generated by address sequencer 68 equals the previous address plus the address step increment contained in register 72. This address step increment need not equal the value of integer one but may equal any positive or negative value. Furthermore, if the number of bits carried on the buses that couple together register 72, adder 70, register 66, and sequencer 68 is greater than the number of bits provided at the output of address sequence 68, then subsequent addresses may be incremented in fractional steps.

Address sequencer 68 may be preset, or initialized, with a random access address by applying an active signal on the present terminal 44, supplying data at the data control input terminals 34, and clocking the clock signal of address sequencer 68. Thus, this initializing random access address is loaded directly into sequencer 68. In addition, address sequencer 68 may be cleared, or reset, by applying a reset signal to the clear input terminal 42.

Referring additionally to FIG. 1, the address sequencer 68 depicted in FIG. 5 is useful in performing the split screen special effect where an entire frame is displayed in only a small portion of a video screen, such as the lower right hand area 13 shown in FIG. 1. With this special effect, if memory circuit 14 has every pixel 12 of a frame 10 stored therein, then only one out of every group of a predetermined number of stored pixels is active in constructing the shrunken screen. Address sequencer 68 shown in FIG. 5 allows memory circuit 14 to provide only the active pixels by supplying a sequence of addresses which omits inactived pixel addresses.

In summary, the present invention provides a memory circuit which allows a video system to efficiently perform special effects. Specifically, the inclusion of various limited random accessing features allows memory circuit 14 to store and/or provide only active pixels for a given special effect and not inactive pixels. Consequently, active pixels may be retrieved from memory circuit 14 much quicker than occurs with the use of prior art frame memory circuits.

The foregoing description uses preferred embodiments to illustrate the present invention. However, those skilled in the art will recognize that changes and modifications may be made in these embodiments without departing from the scope of the present invention. For example, read address generator 28b need not precisely resemble write address generator 28a. Additionally, although the embodiments depicted in FIGS. 3–5 are mentioned above as being alternative embodiments, nothing prevents one skilled in the art from combining the teaching from more than one of these alternate embodiments into a single frame memory circuit 14. Moreover, those skilled in the art will recognize that additional address processing capabilities may be built into frame memory circuit 14. Such additional address processing capabilities may include the addition of a signal which indicates the end of a frame line, a signal which indicates the end of a frame, and the automatic transferring of random access addresses to an address sequencer upon the occurrence of the end of line and end of frame signals. Furthermore, although specific frame and memory array dimensions have been presented herein to aid in teaching the present invention, it is intended that the present invention not be limited to any particular dimensions. These and other modifications obvious to those skilled in the art are intended to be included within the scope of the present invention.

What is claimed is:

1. A synchronous data system comprising:
   A. a processor that includes an address port, the address port including a certain number of plural address terminals sending parallel address signals to external the processor, the address signals occurring in plural groups separated in time, the address signals indicating an address of a random location in memory; and
   B. a synchronous dynamic random access memory device including:
      i. a single chip integrated circuit;
      ii. a dynamic random access memory array formed on the chip, the array including plural array data leads carrying parallel data signals to and from the array and parallel array address leads carrying parallel address signals to the array, one data signal representing one data bit and one address signal representing one address bit, the array being organized in plural addressable locations with each location containing one data word of plural data bits and each location being randomly addressable by the address signals for writing and reading of one word of data bits from the array data leads to each addressed location;
      iii. a first clock signal terminal formed on the chip for receiving a first clock signal formed of rising and falling edges regularly spaced in time, the first clock signal being continuous during operation of the device;
      iv. a second clock signal terminal formed on the chip for receiving a second clock signal formed of rising and falling edges regularly spaced in time, the second clock signal being continuous during operation of the device;
      v. an address port formed on the chip, the address port including plural address terminals coupled to the plural address terminals of the processor and receiving parallel address signals from the processor, the received address signals occurring in plural groups separated in time and being received while the first and second clock terminals receive the first and second continuous clock signals, the address terminals being coupled to the array address leads and the received address signals indicating an address of a random location in the array, the address port including a control data buffer connected to the plural address terminals, the control data buffer receiving address control data signals from the address terminals for controlling the parallel address signals carried to the array;
      vi. plural data terminals formed on the chip for sending and receiving parallel data signals, each set of parallel data signals representing one data word;
      vii. an input data port formed on the chip and coupling the plural data terminals with the array data leads, the input data port receiving the parallel data signals synchronous with the first continuous clock signal for writing the data signals in the array at the random location indicated by the received address signals; and
      viii. an output data port formed on the chip and coupling the array data leads with the plural data terminals, the output data port sending the parallel data signals synchronous with the second continuous clock signal for reading the data signals from the array at the random location indicated by the received address signals.

2. The system of claim 1 in which there are separate data terminals for data input and for data output, the input and output data ports are separate from one another, and the address port includes a separate write address port and a separate read address port.

3. The system of claim 1 in which the first clock signal terminal receives a write clock signal.

4. The system of claim 1 in which the second clock signal terminal receives a read clock signal.

5. The system of claim 1 in which the first clock signal occurs at the same rate as the second clock signal.

6. The system of claim 1 in which the first clock signal occurs at a rate different from the rate of the second clock signal.

7. The system of claim 1 in which there are eight data terminals.

8. The system of claim 1 in which there are four data input terminals and there are four data output terminals.

9. The system of claim 1 including at least one plural bit data register between the array data leads and the data terminals.

10. The system of claim 1 in which the input data port includes an input data register between the array data leads and the data terminals.

11. The system of claim 1 in which the output data port includes an output data register between the array data leads and the data terminals.

12. The system of claim 1 including at least one address buffer register connected between the address terminals and the array address leads, the at least one address buffer providing sequential addresses to the memory array starting from the address received from external the chip to provide serial access of the memory array.

13. The system of claim 1 in which there are eight address terminals and including plural eight bit address registers connected between the address terminals and the array address leads and each register storing one group of received address signals from external the chip.

14. The system of claim 1 in which there are eight address terminals.

15. The system of claim 1 in which the address terminals are different from the data terminals.

16. The system of claim 1 in which the control data buffer includes an address offset buffer receiving an address offset value to be added to the address received at the address port for changing the starting address of the sequence of addresses.

17. The system of claim 1 in which the control data buffer includes a register receiving an increment step value to be added to a previous address to obtain a subsequent address.

* * * * *